United States Patent
Lee et al.

(10) Patent No.: US 10,191,099 B2
(45) Date of Patent: Jan. 29, 2019

(54) SEMICONDUCTOR TEST DEVICE AND METHOD, AND DATA ANALYSIS DEVICE

(71) Applicant: SAMSUNG ELECTRONICS CO., LTD., Suwon-si, Gyeonggi-Do (KR)

(72) Inventors: Soon-Young Lee, Ansan-si (KR); Sang-Woo Pae, Seongnam-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 15 days.

(21) Appl. No.: 15/244,780

(22) Filed: Aug. 23, 2016

(65) Prior Publication Data

US 2017/0082682 A1   Mar. 23, 2017

(30) Foreign Application Priority Data

Sep. 18, 2015   (KR) .......................... 10-2015-0132027

(51) Int. Cl.
| | | |
|---|---|---|
| *G01R 31/00* | (2006.01) | |
| *G01R 31/3181* | (2006.01) | |
| *G01R 31/303* | (2006.01) | |

(52) U.S. Cl.
CPC ..... *G01R 31/002* (2013.01); *G01R 31/31816* (2013.01); *G01R 31/303* (2013.01)

(58) Field of Classification Search
CPC ............ G01R 31/2894; G01R 31/2853; G11C 29/022; G11C 29/816
USPC ................................... 324/71.11, 73.1, 76.11
See application file for complete search history.

(56) References Cited

U.S. PATENT DOCUMENTS

| | | | |
|---|---|---|---|
| 6,144,103 A | 11/2000 | Miller et al. | |
| 6,239,479 B1 | 5/2001 | Hwang et al. | |
| 6,410,414 B1 | 6/2002 | Lee | |
| 6,531,759 B2 | 3/2003 | Wachnik et al. | |
| 6,578,574 B1 | 6/2003 | Kohnke | |
| 6,617,972 B2* | 9/2003 | Takarada | G08B 21/0484 324/538 |
| 7,081,635 B2 | 7/2006 | Baumann | |
| 7,386,817 B1 | 6/2008 | Fiorenza et al. | |

(Continued)

FOREIGN PATENT DOCUMENTS

| | | |
|---|---|---|
| EP | 2 100 241 | 9/2009 |
| EP | 2 529 325 | 12/2012 |

(Continued)

OTHER PUBLICATIONS

Michael S. Gordon, et al., "Alpha-Particle Emission Energy Spectra From Materials Used for Solder Bumps," IEEE Transactions on Nuclear Science, vol. 57, No. 6, Dec. 2010.

(Continued)

*Primary Examiner* — Giovanni Astacio-Oquendo
(74) *Attorney, Agent, or Firm* — F. Chau & Associates, LLC

(57) ABSTRACT

A semiconductor test device includes an actuator holding a radiation source and adjusting a distance between the radiation source and a sample, and a controller controlling an operation of the actuator and calculating a soft error rate (SER) of the sample based on the distance between the radiation source and the sample. The controller calculates a first distance between the radiation source and the sample at which the SER of the sample becomes zero, and calculates a metal-to-dielectric ratio of the sample based on the first distance.

12 Claims, 13 Drawing Sheets

(56) References Cited

U.S. PATENT DOCUMENTS

| | | |
|---|---|---|
| 7,451,418 B2 | 11/2008 | Porter et al. |
| 7,675,789 B2 | 3/2010 | Chen et al. |
| 7,781,871 B2 | 8/2010 | Cabral, Jr. et al. |
| 7,877,716 B2 | 1/2011 | Fiorenza et al. |
| 7,893,505 B2 | 2/2011 | Nishida et al. |
| 8,102,033 B2 | 1/2012 | Muller et al. |
| 8,106,664 B2 | 1/2012 | Chang et al. |
| 8,129,267 B2 | 3/2012 | Cabral, Jr. et al. |
| 8,145,959 B2 | 3/2012 | Mims et al. |
| 8,261,229 B2 | 9/2012 | Hart |
| 8,362,600 B2 | 1/2013 | Cabral, Jr. et al. |
| 8,410,605 B2 | 4/2013 | Hart |
| 8,748,800 B2 | 6/2014 | Hossain et al. |
| 8,779,729 B2 * | 7/2014 | Shiraishi ............ G01R 31/3606 320/134 |
| 9,910,053 B2 * | 3/2018 | Bakhru ............. G01N 33/4905 |
| 2007/0166847 A1 | 7/2007 | Fulkerson |
| 2012/0031559 A1 | 2/2012 | Dhindsa et al. |
| 2012/0098518 A1 * | 4/2012 | Unagami ............. G01R 22/066 324/74 |
| 2014/0203814 A1 | 7/2014 | Paffrath et al. |
| 2014/0205780 A1 | 7/2014 | Gaynes et al. |
| 2014/0320144 A1 * | 10/2014 | Nakaya ................ H01M 10/54 324/434 |
| 2017/0264110 A1 * | 9/2017 | Toya .................... H02J 7/0021 |

FOREIGN PATENT DOCUMENTS

| | | |
|---|---|---|
| KR | 1020090085074 | 8/2009 |
| KR | 10-1383468 | 4/2014 |
| WO | WO 2008/082938 | 7/2008 |
| WO | WO 2011/093961 | 8/2011 |

OTHER PUBLICATIONS

JESD89A, "Measurement and Reporting of Alpha Particle and Terrestrial Cosmic Ray-Induced Soft Errors in Semiconductor Devices", JEDEC Solid State Technology Association, Oct. 2006.

JESD221, "Alpha Radiation Measurement in Electronic Materials," JEDEC Solid State Technology Association, May 2011.

Rick Wong, et al., "Assessment of Soft Errors Due to Alpha Emissions From Presolder on Flip Chip Devices," IEEE-SCV Soft Error Rate Workshop, CPMT Society Chapter, Oct. 30, 2009.

\* cited by examiner

<SER vs. Distance Plot>

FIG. 13A

<Alpha-Particle : 1.0 MeV>

| Metal/Dielectric Ratio | Penetration depth(um) | Note |
|---|---|---|
| 0.0 | 3.4 | Dielectric 100% |
| 0.2 | 3.1 | |
| 0.4 | 2.8 | |
| 0.6 | 2.5 | |
| 0.8 | 2.2 | |
| 1.0 | 1.9 | Metal 100% |

FIG. 13B

<Alpha-Particle : 3.0 MeV>

| Metal/Dielectric Ratio | Penetration depth(um) | Note |
|---|---|---|
| 0.0 | 10.9 | Dielectric 100% |
| 0.2 | 9.82 | |
| 0.4 | 8.74 | |
| 0.6 | 7.66 | |
| 0.8 | 6.58 | |
| 1.0 | 5.5 | Metal 100% |

FIG. 13C

<Alpha-Particle : 5.5 MeV>

| Metal/Dielectric Ratio | Penetration depth(um) | Note |
|---|---|---|
| 0.0 | 25.1 | Dielectric 100% |
| 0.2 | 22.4 | |
| 0.4 | 19.7 | |
| 0.6 | 16.9 | |
| 0.8 | 14.2 | |
| 1.0 | 11.5 | Metal 100% |

SEMICONDUCTOR TEST DEVICE AND METHOD, AND DATA ANALYSIS DEVICE

CROSS-REFERENCE TO RELATED APPLICATIONS

This application claims priority under 35 U.S.C. § 119 to Korean Patent Application No. 10-2015-0132027 filed on Sep. 18, 2015, the disclosure of which is incorporated by reference herein in its entirety.

TECHNICAL FIELD

Exemplary embodiments of the present inventive concept relate to a semiconductor test device and method, and a data analysis device.

DISCUSSION OF THE RELATED ART

A soft error of an integrated circuit (IC) may occur due to ionized radiation such as, for example, alpha particles passing through a semiconductor element of the IC. This type of error is called a soft error because it only lingers until the next cycle of the IC's function.

When the alpha particles penetrate the semiconductor element, a cloud of pairs of holes and electrons may be generated along a path of movement of the alpha particles. An electric field present in the IC moves the holes and electrons in opposite directions so as for electric charges to arrive at a particular circuit node, and thus, the IC's function may be affected.

As the scaling of ICs continues, the capacitor cell size and operating voltage continuously decrease, and the circuit density increases. As a result, the soft error rate (SER) of ICs may increase.

SUMMARY

Exemplary embodiments of the inventive concept provide a device capable of measuring the soft error rate (SER) of an integrated circuit (IC), thus, providing a solution for reducing the SER of the IC.

Exemplary embodiments of the inventive concept provide a semiconductor test device capable of efficiently measuring the energy consumption of alpha particles and providing data for improving soft error rate based on the results of the measurement.

Exemplary embodiments of the inventive concept also provide a data analysis device capable of calculating the SER based on data regarding the energy consumption of alpha particles and calculating the metal-to-dielectric ratio of a sample based on the calculated SER.

Exemplary embodiments of the inventive concept also provide a semiconductor test method capable of calculating the SER based on data regarding the energy consumption of alpha particles and calculating the metal-to-dielectric ratio of a sample based on the calculated SER.

According to an exemplary embodiment of the inventive concept, a semiconductor test device includes an actuator holding a radiation source and adjusting a distance between the radiation source and a sample, and a controller controlling an operation of the actuator and calculating the soft error rate (SER) of the sample based on the distance between the radiation source and the sample. The controller calculates a first distance between the radiation source and the sample at which the SER of the sample becomes zero, and calculates a metal-to-dielectric ratio of the sample based on the first distance.

In exemplary embodiments of the inventive concept, the controller calculates a metal-to-dielectric ratio of a Back-End-Of-Line (BEOL) layer included in the sample based on a thickness of a passivation layer included in the sample and a thickness of the BEOL layer.

In exemplary embodiments of the inventive concept, the controller calculates the metal-to-dielectric ratio of the BEOL layer using a lookup table (LUT) showing a relationship between the thickness of the BEOL layer and the metal-to-dielectric ratio of the BEOL layer.

In exemplary embodiments of the inventive concept, the controller calculates the metal-to-dielectric ratio of the BEOL layer based on data regarding a relationship between radiation energy loss in a material and a thickness of the material.

In exemplary embodiments of the inventive concept, the controller controls the actuator to change the distance between the radiation source and the sample from zero to the first distance.

In exemplary embodiments of the inventive concept, the controller calculates a second distance between the radiation source and the sample at which the SER of the sample reaches its peak.

In exemplary embodiments of the inventive concept, the first distance and the second distance are calculated based on data regarding a relationship between the SER of the sample and the distance between the radiation source and the sample.

In exemplary embodiments of the inventive concept, the controller calculates the SER of the sample based on a number of single events (SEs) occurring in the sample for a predefined amount of time. The SEs may correspond to errors occurring in the sample due to alpha particles emitted from the radiation source.

In exemplary embodiments of the inventive concept, the controller includes a memory, which stores a test pattern for detecting an SE from the sample, and a result value for the test pattern. In response to an SE occurring in the sample, the controller corrects a value of a portion of the sample where the SE has occurred with the result value for the test pattern.

In exemplary embodiments of the inventive concept, the radiation source includes a radioactive material emitting alpha particles.

In exemplary embodiments of the inventive concept, the actuator includes a pillar unit substantially perpendicularly disposed on a substrate and moving in a first direction over the substrate, a connecting unit moving in a second direction, which is substantially perpendicular to the first direction, by being guided by the pillar unit, and a holding unit connected to an end of the connecting unit and holding the radiation source.

In exemplary embodiments of the inventive concept, the holding unit has an opening, which is formed at a bottom surface of the holding unit and exposes part of the radiation source therethrough.

In exemplary embodiments of the inventive concept, the pillar unit aligns a center of the sample and a center of the radiation source.

In exemplary embodiments of the inventive concept, the semiconductor test device further includes a sub-controller controlling operations of the pillar unit and the connecting unit, and controlled by the controller.

In exemplary embodiments of the inventive concept, the sub-controller is disposed on a side of the pillar unit.

In exemplary embodiments of the inventive concept, the semiconductor test device further includes a device under test (DUT) board fixing the sample, supplying power to the sample, and transmitting data obtained from the sample to the controller.

In exemplary embodiments of the inventive concept, the semiconductor test device further includes a control terminal transmitting a test pattern and a test command to the controller, and receiving data regarding the metal-to-dielectric ratio of the sample from the controller.

In exemplary embodiments of the inventive concept, the control terminal is connected to the controller in a wireless or wired manner.

In exemplary embodiments of the inventive concept, the sample includes a passivation layer, a BEOL layer, and a Front-End-Of-Line (FEOL) layer.

In exemplary embodiments of the inventive concept, the metal includes copper (Cu) or tungsten (W).

According to an exemplary embodiment of the inventive concept, a semiconductor test device includes an actuator aligning a center of a radiation source and a center of a sample, and adjusting a distance between the radiation source and the sample, and a controller controlling an operation of the actuator and calculating a metal-to-dielectric ratio of a BEOL layer included in the sample. The actuator includes a pillar unit substantially perpendicularly disposed on a substrate and moving in a first direction over the substrate, a connecting unit moving in a second direction, which is substantially perpendicular to the first direction, by being guided by the pillar unit, and a holding unit connected to an end of the connecting unit and holding the radiation source.

In exemplary embodiments of the inventive concept, the controller calculates a first distance between the radiation source and the sample at which SER of the sample becomes zero, and calculates a metal-to-dielectric ratio of the BEOL layer based on the first distance.

In exemplary embodiments of the inventive concept, the controller calculates the metal-to-dielectric ratio of the BEOL layer based on a thickness of a passivation layer included in the sample and a thickness of the BEOL layer.

In exemplary embodiments of the inventive concept, the controller calculates the metal-to-dielectric ratio of the BEOL layer using a lookup table (LUT) showing a relationship between the thickness of the BEOL layer and the metal-to-dielectric ratio of the BEOL layer.

In exemplary embodiments of the inventive concept, the controller calculates a second distance between the radiation source and the sample at which the SER of the sample reaches its peak.

In exemplary embodiments of the inventive concept, the controller calculates the SER of the sample based on a number of SEs occurring in the sample for a predefined amount of time.

In exemplary embodiments of the inventive concept, the controller controls the actuator to change the distance between the radiation source and the sample from zero to the first distance.

In exemplary embodiments of the inventive concept, the first direction includes a direction on an X-Y plane, and the second direction includes a Z-axis direction substantially perpendicular to the X-Y plane.

According to an exemplary embodiment of the inventive concept, a data analysis device includes a processor and a memory storing a data analysis module, which receives input data and calculates a metal-to-dielectric ratio of a sample using the processor. The input data includes a frequency of occurrence of SEs corresponding to a measured distance between the sample and a radiation source. The processor calculates the SER of the sample based on the frequency of occurrence of SEs, calculates a first distance between the radiation source and the sample at which the SER of the sample becomes zero, and a second distance between the radiation source and the sample at which the SER of the sample reaches its peak, based on data regarding a relationship between the SER of the sample and a distance between the sample and the radiation source, and calculates a metal-to-dielectric ratio of the sample based on the first distance.

According to an exemplary embodiment of the inventive concept, a data analysis device includes a memory storing a computer program and receiving input data, and a processor configured to execute the computer program. The input data includes a frequency of occurrence of single events (SEs) corresponding to a measured distance between a sample and a radiation source. The computer program is configured to calculate a soft error rate (SER) of the sample based on the frequency of occurrence of SEs, calculate a first distance between the radiation source and the sample at which the SER of the sample becomes zero, and a second distance between the radiation source and the sample at which the SER of the sample reaches its peak, based on data regarding a relationship between the SER of the sample and a distance between the sample and the radiation source, and calculate a metal-to-dielectric ratio of the sample based on the first distance.

In exemplary embodiments of the inventive concept, the processor calculates a metal-to-dielectric ratio of a BEOL layer included in the sample based on a thickness of a passivation layer included in the sample and a thickness of the BEOL layer.

In exemplary embodiments of the inventive concept, the processor calculates the metal-to-dielectric ratio of the BEOL layer using an LUT showing a relationship between the thickness of the BEOL layer and the metal-to-dielectric ratio of the BEOL layer.

In exemplary embodiments of the inventive concept, the processor calculates the metal-to-dielectric ratio of the BEOL layer based on data regarding a relationship between radiation energy loss in a material and a thickness of the material.

In exemplary embodiments of the inventive concept, the memory stores a test pattern to be transmitted to the sample, a result value for the test pattern, and the frequency of occurrence of SEs.

In exemplary embodiments of the inventive concept, in response to an SE occurring in the sample, the processor corrects a value of a portion of the sample where the SE has occurred with the result value stored in the memory.

In exemplary embodiments of the inventive concept, the frequency of occurrence of SEs is calculated based on a number of SEs occurring in the sample for a predefined amount of time.

According to an exemplary embodiment of the inventive concept, a data analysis device includes a memory storing an algorithm and an LUT for calculating a metal-to-dielectric ratio of a BEOL layer included in a sample, and a processor executing the algorithm. The LUT includes data regarding a relationship between a thickness of the BEOL layer and the metal-to-dielectric ratio of the BEOL layer, and the algorithm calculates a first distance between a radiation source and the sample at which SER of the sample becomes zero based on SEs occurring in the sample, and calculates the metal-to-dielectric ratio of the BEOL layer based on the first distance and the LUT.

In exemplary embodiments of the inventive concept, the algorithm calculates the SER of the sample based on a number of SEs occurring in the sample for a predefined amount of time.

In exemplary embodiments of the inventive concept, the memory stores a test pattern for detecting an SE from the sample and a result value for the test pattern, and in response to an SE occurring in the sample, the algorithm corrects a value of a portion of the sample where the SE has occurred with the result value for the test pattern.

According to an exemplary embodiment of the inventive concept, a semiconductor test method includes measuring a frequency of occurrence of SEs corresponding to a measured distance between a sample and a radiation source, calculating the SER of the sample based on the measured frequency of occurrence of SEs, calculating a first distance between the radiation source and the sample at which the SER of the sample becomes zero based on data showing a relationship between the SER of the sample and the measured distance, and calculating a metal-to-dielectric ratio of the sample based on the first distance.

In exemplary embodiments of the inventive concept, the semiconductor test method further includes calculating a second distance between the radiation source and the sample at which the SER of the sample reaches its peak.

In exemplary embodiments of the inventive concept, calculating the metal-to-dielectric ratio of the sample includes calculating the metal-to-dielectric ratio of a BEOL layer included in the sample.

In exemplary embodiments of the inventive concept, calculating the metal-to-dielectric ratio of the BEOL layer includes calculating the metal-to-dielectric ratio of the sample using an LUT showing a relationship between a thickness of the BEOL layer and the metal-to-dielectric ratio of the BEOL layer.

In exemplary embodiments of the inventive concept, calculating the metal-to-dielectric ratio of the sample includes calculating the metal-to-dielectric ratio of a BEOL layer included in the sample based on the first distance, a thickness of a passivation layer included in the sample, and a thickness of the BEOL layer.

In exemplary embodiments of the inventive concept, the frequency of occurrence of SEs is calculated based on a number of SEs occurring in the sample for a predefined amount of time.

According to an exemplary embodiment of the inventive concept, a semiconductor test method includes setting a distance between a radiation source and a sample to zero, measuring a soft error rate (SER) of the sample, increasing a distance between the radiation source and the sample until the SER is equal to zero, plotting a graph of the SER of the sample against the distance between the radiation source and the sample based on data regarding the relationship between the SER of the sample and a measured distance between the radiation source and the sample, and analyzing the plotted graph.

In exemplary embodiments, measuring the SER of the sample includes storing a test pattern and a result value for the test pattern on a memory, determining whether a single event (SE) has occurred in the sample, and correcting a value of a portion of the sample where the SE has occurred using the result value for the test pattern upon determining that the SE has occurred. The SE may correspond to an error occurring in the sample due to alpha particles emitted from the radiation source.

In exemplary embodiments, analyzing the plotted graph includes determining a first distance at which the SER of the sample becomes zero using the plotted graph, determining a second distance at which the SER of the sample is at its peak using the plotted graph, and calculating a metal-to-dielectric ratio of the sample based on the second distance.

BRIEF DESCRIPTION OF THE DRAWINGS

The above and other features of the present inventive concept will become more apparent by describing in detail exemplary embodiments thereof with reference to the accompanying drawings, in which:

FIGS. 13A through 13C are tables showing penetration depths and metal-to-dielectric ratios for various radiation energies according to exemplary embodiments of the inventive concept.

DETAILED DESCRIPTION OF THE EXEMPLARY EMBODIMENTS

Figure 1:
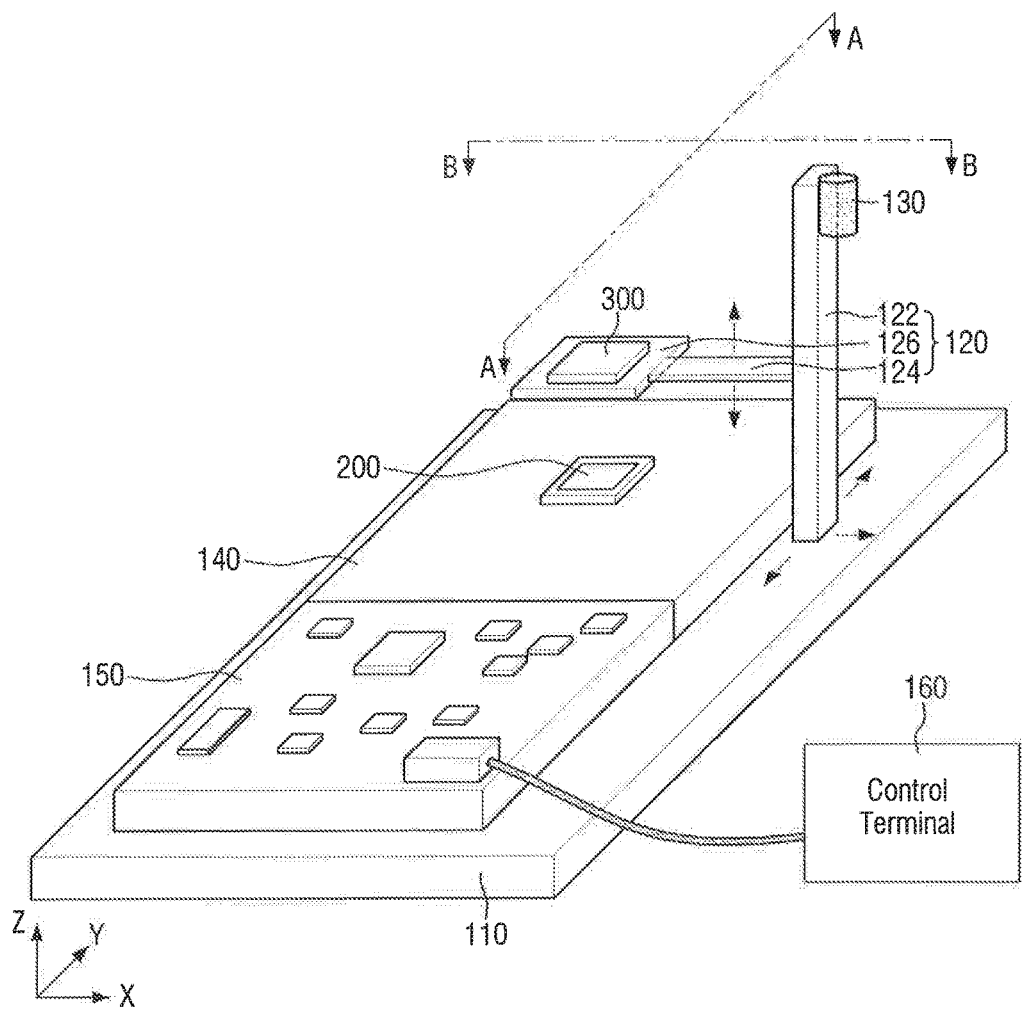
FIG. 1 is a perspective view of a semiconductor test device according to exemplary embodiments of the inventive concept.

Exemplary embodiments of the present inventive concept will be described more fully hereinafter with reference to the accompanying drawings. In the drawings, the size and relative sizes of layers and regions may be exaggerated for clarity. Like reference numerals may refer to like elements throughout the accompanying drawings.

In the drawings, the thickness of layers and regions may be exaggerated for clarity. It will be understood that when an element or layer is referred to as being "connected to," or "coupled to" another element or layer, it can be directly connected to or coupled to another element or layer, or intervening elements or layers may be present. As used herein, the term "and/or" includes any and all combinations of one or more of the associated listed items.

It will also be understood that when a layer is referred to as being "on" another layer or substrate, it can be directly on the other layer or substrate, or intervening layers may also be present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept are to be construed to cover both the singular and the plural, unless otherwise indicated.

Herein, when two or more elements are described as being disposed substantially parallel or perpendicular to one another, it is to be understood that the two or more elements are disposed exactly parallel or perpendicular to one another, or are approximately parallel or perpendicular to one another as would be understood by a person having ordinary skill in the art. Further, when two or more elements are described as having a substantially identical shape, it is to be understood that the two or more elements have exactly the same shape, or have approximately the same shape as would be understood by a person having ordinary skill in the art. Further, when two are more elements are described as being substantially aligned with one another, it is to be understood that the two or more elements are exactly aligned with one another, or are approximately aligned with one another as would be understood by a person having ordinary skill in the art.

A semiconductor test device and method, and a data analysis device according to exemplary embodiments of the inventive concept will be described with reference to FIGS. 1 to 13C.

Figure 2:
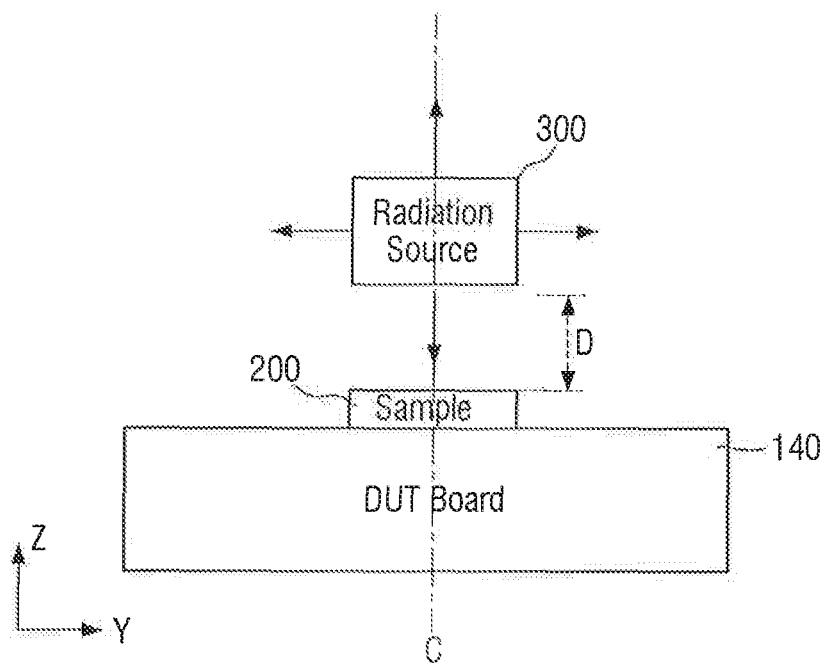
FIG. 2 is a cross-sectional view taken along line A-A of FIG. 1 according to exemplary embodiments of the inventive concept.
Figure 3:
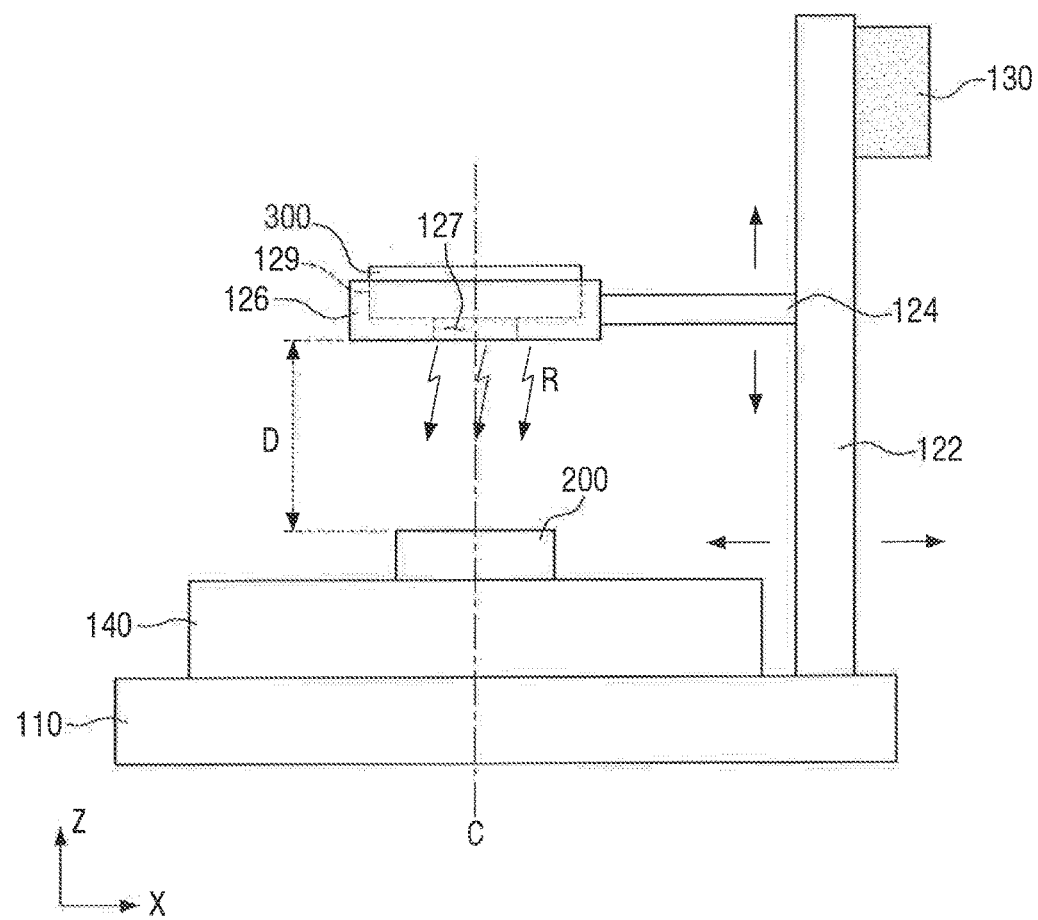
FIG. 3 is a cross-sectional view taken along line B-B of FIG. 1 according to exemplary embodiments of the inventive concept.
Figure 4:
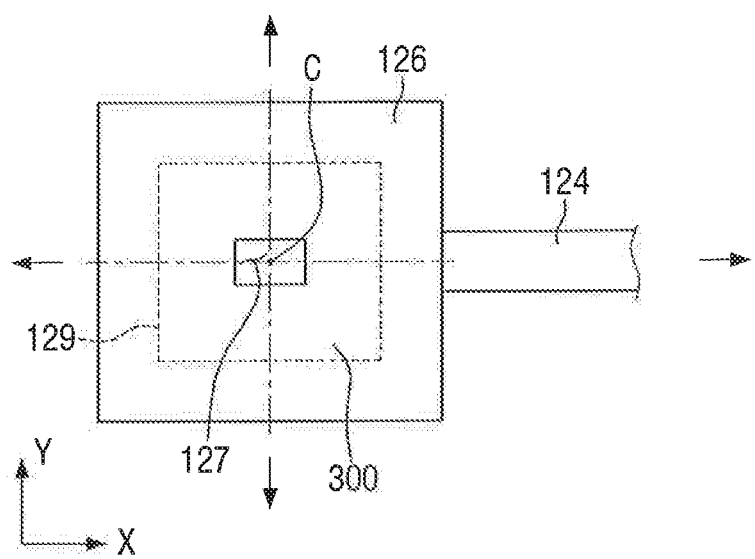
FIG. 4 is a perspective view illustrating the bottom surfaces of a holder unit and a connecting unit of an actuator of FIG. 1 according to exemplary embodiments of the inventive concept.
Figure 5:
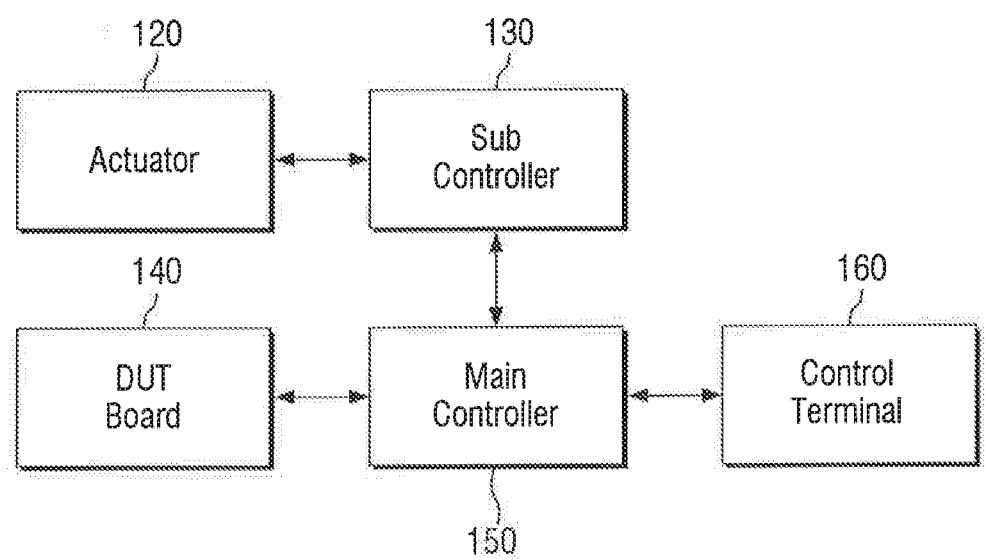
FIG. 5 is a block diagram of the semiconductor test device according to exemplary embodiments of the inventive concept.

FIG. 1 is a perspective view of a semiconductor test device according to exemplary embodiments of the inventive concept. FIG. 2 is a cross-sectional view taken along line A-A of FIG. 1 according to exemplary embodiments of the inventive concept. FIG. 3 is a cross-sectional view taken along line B-B of FIG. 1 according to exemplary embodiments of the inventive concept. FIG. 4 is a perspective view illustrating the bottom surfaces of a holding unit and a connecting unit of an actuator of FIG. 1 according to exemplary embodiments of the inventive concept. FIG. 5 is a block diagram of the semiconductor test device according to exemplary embodiments of the inventive concept.

Referring to FIGS. 1 to 5, a semiconductor test device according to exemplary embodiments of the inventive concept includes a substrate 110, an actuator 120, a sub-controller 130, a device under test (DUT) board 140, a main controller 150, and a control terminal 160.

In exemplary embodiments, the substrate 110 is disposed below the actuator 120, the DUT board 140, and the main controller 150. The substrate 110 supports the actuator 120, the DUT board 140, and the main controller 150. However, exemplary embodiments of the inventive concept are not limited thereto. For example, in exemplary embodiments, the main controller 150 is separate from the substrate 110.

In exemplary embodiments, the substrate 110 may be, for example, a semiconductor substrate. According to exemplary embodiments, the substrate 110 may contain, for example, an organic plastic material, a metallic material, or a dielectric material.

In exemplary embodiments, a driving device for driving a pillar unit 122 of the actuator 120 is provided on the substrate 110. The driving device may be controlled, for example, by the main controller 150 or the sub-controller 130, and may change the location of the pillar unit 122. However, exemplary embodiments of the inventive concept are not limited thereto.

In exemplary embodiments, the actuator 120 is disposed on the substrate 110. According to exemplary embodiments, the actuator 120 may be movable on the substrate 110 along the top surface of the substrate 110, or the actuator 120 may be fixed. The actuator 120 holds a radiation source 300, and the actuator 120 adjusts the location and/or height of the radiation source 300.

The actuator 120 may include, for example, the pillar unit 122, a connecting unit 124, and a holding unit 126.

In exemplary embodiments, the pillar unit 122 is substantially perpendicularly disposed on the substrate 110, and moves in a first direction over the substrate 110. The first direction may be any arbitrary direction on an X-Y plane. For example, the pillar unit 122 may move back and forth, left and right and diagonally on the top surface of the substrate 110, as indicated by the arrows corresponding to the pillar unit 122 shown in FIG. 1. However, exemplary embodiments of the inventive concept are not limited thereto.

In exemplary embodiments, the connecting unit 124 moves in a second direction, which is substantially perpendicular to the first direction, by being guided by the pillar unit 122. That is, the connecting unit 124 is moved by the pillar unit 122. The second direction may be a Z-axis direction, which is substantially perpendicular to the X-Y plane. Accordingly, in exemplary embodiments, the connecting unit 124 may move up and down along one side of the pillar unit 122, as indicated by the arrows corresponding to the connecting unit 124 shown in FIG. 1. The connecting unit 124 may be disposed substantially perpendicularly to one side of the pillar unit 122. However, exemplary embodiments of the inventive concept are not limited thereto.

In exemplary embodiments, the holding unit 126 is connected to one end of the connecting unit 124, and holds the radiation source 300. A trench 129 is formed at the top of the holding unit 126 so as to hold the radiation source 300 therein. A cross-sectional shape of the trench 129 matches a cross-sectional shape of the radiation source 300. For example, the shape of one surface of the radiation source 300 may be substantially identical to the shape of the bottom surface of the trench 129. The trench 129 may be coupled to the radiation source 300 and may thus fix the radiation source 300 so as not to move over the holding unit 126. However, exemplary embodiments of the inventive concept are not limited thereto.

In exemplary embodiments, the holding unit 126 is integrally formed with the connecting unit 124. The holding unit 126 may be formed of the same material as the connecting unit 124. For example, the holding unit 126 may be formed of a material that cannot be penetrated by radiation. One surface of the holding unit 126 may be larger than one surface of the connecting unit 124. However, exemplary embodiments of the inventive concept are not limited thereto.

Referring to FIG. 4, in exemplary embodiments, the holding unit 126 includes an opening 127 at the bottom thereof. The opening 127 may be located near a center C of the bottom of the holding unit 126. The opening 127 exposes part of the radiation source 300 therethrough, and part of radiation R emitted from the radiation source 300 may be emitted downward through the opening 127. In FIG. 4, the opening 127 is illustrated as being rectangular. However, exemplary embodiments of the inventive concept are not limited thereto. For example, the opening 127 may have various other shapes such as a circular shape, an oval shape, or a polygonal shape.

In exemplary embodiments, the holding unit 126 includes an adjusting device for adjusting the size of the opening 127. By adjusting the size of the opening 127 via the adjusting device, the intensity or flux of radiation R emitted downward may be adjusted.

In exemplary embodiments, a sample 200 is disposed below the holding unit 126. The actuator 120 moves the pillar unit 122 such that a center C of the radiation source 300 held in the holding unit 126 is substantially aligned with a center C of the sample 200 disposed below the holding unit 126. The actuator 120 may adjust the distance between the radiation source 300 and the sample 200.

In exemplary embodiments, the sub-controller 130 controls the operations of the pillar unit 122 and the connecting unit 124. For example, the sub-controller 130 may adjust the movement of the pillar unit 122 over the substrate 110 and the movement of the connecting unit 124 over the pillar unit 122. Thus, the center C of the sample 200 and the center C of the radiation source 300 may be aligned to overlap each other. The operation of the sub-controller 130 may be controlled by the main controller 150.

As illustrated in FIG. 3, in exemplary embodiments, the sub-controller 130 is disposed on one side of the pillar unit 122. The sub-controller 130 may be disposed to be in contact with an upper portion of the pillar unit 122. The sub-controller 130 may be disposed on an opposite side of the pillar unit 122 relative to the connecting unit 124, which is guided by the pillar unit 122. However, exemplary embodiments of the inventive concept are not limited thereto. For example, in exemplary embodiments, the sub-controller 130 may be included in the actuator 120 or in the main controller 150.

In exemplary embodiments, The DUT board 140 fixes the sample 200 (e.g., the DUT board 140 securely holds the sample 100). The DUT board 140 may supply power to the sample 200, and may transmit data measured from the sample 200 to the main controller 150. The DUT board 140 may be controlled by the main controller 150. The DUT board 140 may serve as a bridge connecting the sample 200 and the main controller 150. The DUT board 140 may uniformly maintain power supplied to the sample 200, and may control the supply of power. However, exemplary embodiments of the inventive concept are not limited thereto.

In exemplary embodiments, the main controller 150 controls the operation of the actuator 120, and calculates the soft error rate (SER) of the sample 200 based on a distance D between the radiation source 300 and the sample 200. The main controller 150 controls the operation of the sample 200. The main controller 150 stores an algorithm for testing the sample 200, a test pattern, and a result value for the test pattern. The main controller 150 calculates a first distance between the radiation source 300 and the sample 200 at which the SER of the sample 200 becomes zero, and calculates the metal-to-dielectric ratio of the sample 200 based on the first distance.

In exemplary embodiments, the main controller 150 also calculates a second distance between the radiation source 300 and the sample 200 at which the SER of the sample 200 reaches its peak. The first distance and the second distance may be calculated based on SER data for different distances between the radiation source 300 and the sample 200 (see, for example, the graph of FIG. 11). Thus, the main controller 150 may control the actuator 120 to change the distance D between the radiation source 300 and the sample 200 from zero to the first distance.

The calculation of the metal-to-dielectric ratio of the sample 200 by the main controller 150 will be described later with reference to FIGS. 8 to 10.

In exemplary embodiments, the main controller 150 includes a processor for executing an algorithm, and a memory for storing the algorithm and data for computation. However, exemplary embodiments of the inventive concept are not limited thereto.

In exemplary embodiments, the control terminal 160 transmits a test pattern and a test command to the main controller 150, and receives data regarding the metal-to-dielectric ratio of the sample 200. The control terminal 160 and the main controller 150 are illustrated as being connected via a wired connection. However, exemplary embodiments of the inventive concept are not limited thereto. For example, in exemplary embodiments, the control terminal 160 and the main controller 150 are connected via a wireless connection.

In exemplary embodiments, the control terminal 160 provides a user with an interface for controlling the semiconductor test device. Thus, the user may control the main controller 150 via the control terminal 160. For example, the control terminal 160 may correct an existing algorithm present in the main controller 150 or add a new algorithm to the main controller 150, and may control the operation of the actuator 120, via the main controller 150. The control terminal 160 may provide a test pattern and a test command to the main controller 150, and may run and test the sample 200. The control terminal 160 may receive results of the testing of the sample 200 from the main controller 150 and may provide the received results to the user.

The control terminal 160 may be implemented as, for example, a Personal Computer (PC), an Ultra Mobile PC (UMPC), a workstation, a net-book, a Personal Digital Assistant (PDA), a portable computer, a web tablet, a wireless phone, a mobile phone, a smartphone, an electronic-book (e-book), a Portable Multimedia Player (PMP), a navigation device, a black box, an apparatus capable of transmitting and/or receiving information in a wireless environment, one of a variety of electronic devices that constitute a home network, one of a variety of electronic devices that constitute a computer network, one of a variety of electronic devices that constitute a telematics network, a Radio Frequency IDentification (RFID) device, one of a variety of electronic devices that constitute a computing system, etc. The control terminal 160 may be applicable to nearly all types of electronic products capable of transmitting and/or receiving information either in a wired or wireless environment. However, exemplary embodiments of the inventive concept are not limited thereto.

Figure 6:
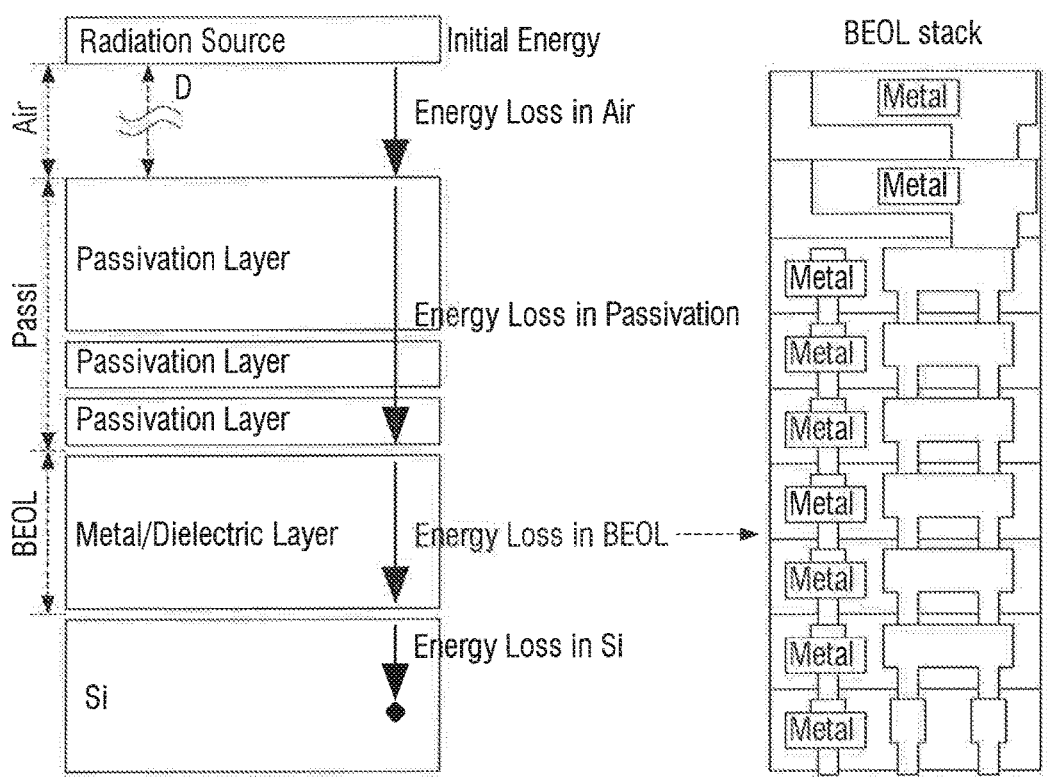
FIG. 6 is a schematic view illustrating a radiation source and a sample according to exemplary embodiments of the inventive concept.

FIG. 6 is a schematic view illustrating a radiation source and a sample according to exemplary embodiments of the inventive concept.

Referring to FIG. 6, the sample 200 may include a semiconductor element having a passivation layer, a Back-End-Of-Line (BEOL) layer, and a Front-End-Of-Line (FEOL) layer.

The sample 200 is spaced from the radiation source 300 by the distance D. When the distance D is zero, the sample 200 contacts the radiation source 300. A particular material or medium may be disposed between the radiation source 300 and the sample 200. For example, air may be located between the radiation source 300 and the sample 200. However, exemplary embodiments of the inventive concept are not limited thereto. For example, in exemplary embodiments, a medium having different properties (e.g., density, conductivity, etc.) from air may be located between the radiation source 300 and the sample 200.

In the sample 200, the passivation layer, the BEOL layer, and the FEOL layer may be sequentially stacked. The passivation layer may include a stack of a plurality of layers. The passivation layer may protect the BEOL layer or the FEOL layer from external noise or other external environmental factors. Thus, the passivation layer may be exposed. The passivation layer may contain, for example, a metal, a crystalline material, a non-crystalline material, SixNy, SiOxNy, AlOxNy, etc. However, exemplary embodiments of the inventive concept are not limited thereto.

The BEOL layer may include a stack of a metal and a dielectric material. The metal and the dielectric material are contained in the BEOL layer at a particular metal-to-dielectric ratio. The transmittance of radiation particles may vary depending on the metal-to-dielectric ratio of the BEOL layer.

The FEOL layer may include active or passive elements that substantially constitute a circuit. For example, the FEOL layer may include a transistor, a capacitor, a diode, etc. The FEOL layer may be formed on a semiconductor substrate, and the semiconductor substrate may contain, for example, silicon (Si), strained Si, a Si alloy, silicon carbide (SiC), silicon germanium (SiGe), silicon germanium carbide (SiGeC), germanium (Ge), a Ge alloy, gallium arsenide (GaAs), indium arsenide (InAs), one of a III-V semiconductor and a II-VI semiconductor, a combination thereof, or a stack thereof.

The sample 200 may be mounted using various forms of packages. For example, the sample 200 may be mounted using packages such as a Package on Package (PoP), a Ball Grid Array (BGA), a Chip Scale Package (CSP), a Plastic Leaded Chip Carrier (PLCC), a Plastic Dual In Line Package (PDIP), a Die in Waffle Pack (DWP), a Die in Wafer Form (DWF), a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi-Chip Package (MCP), a Wafer-level Fabricated Package (WFP), a Wafer-Level Processed Stack Package (WSP), etc.

The sample 200 may include one or more volatile memory devices such as, for example, Double Data Rate (DDR) Static Dynamic Random Access Memories (SDRAMs) or Single Data Rate (SDR) SDRAMs, which are integrated into a single semiconductor device, and/or one or more non-volatile memory devices such as, for example, Electrical Erasable Programmable Read-Only Memories (EEPROMs) or flash memories.

The radiation source 300 may contain a radioactive material emitting alpha particles. When the radiation source 300 contains a radioactive material emitting alpha particles, the alpha-SER of the sample 200 may be measured. Alpha particles emitted from the radiation source 300 may lose some of their energy while passing through an air layer, and may further lose some of their energy while passing through the passivation layer and the BEOL layer. Then, the alpha particles may arrive at the FEOL layer and may interfere with the operation of the semiconductor elements included in the FEOL layer. The rate of errors caused by the interference of the alpha particles may be measured as SER. Thus, SER is one of the factors of reliability to be considered in a semiconductor fabricating process.

The semiconductor test device according to exemplary embodiments of the inventive concept measures and analyzes the SER of the sample 200, which occurs due to ionized radiation (e.g., from alpha particles), so as to calculate a method to efficiently design a passivation layer or a BEOL layer for reducing the SER of the sample 200. For example, the semiconductor test device according to exemplary embodiments of the inventive concept calculates a first distance, which is the minimum distance between the radiation source 300 and the sample 200 at which the SER of the sample 200 becomes zero, a second distance, which is the distance between the radiation source 300 and the sample 200 at which the SER of the sample 200 reaches its peak, and the metal-to-dielectric ratio of the BEOL layer of the sample 200. Examples of the metal included in the BEOL layer of the sample 200 may include copper (Cu) and tungsten (W).

The semiconductor test device according to exemplary embodiments of the inventive concept uses a lookup table (LUT) showing the relationship between the thickness of a BEOL layer and the metal-to-dielectric ratio of the BEOL layer to calculate the metal-to-dielectric ratio of the BEOL layer of the sample 200. Further, the semiconductor test device according to exemplary embodiments of the inventive concept calculates the metal-to-dielectric ratio of the BEOL layer of the sample 200 based on data regarding the relationship between radiation energy loss in a material and the thickness of the material. However, exemplary embodiments of the inventive concept are not limited to these examples.

Accordingly, the semiconductor test device according to exemplary embodiments of the inventive concept analyze the product characteristics of the sample 200 with respect to alpha particles, and provide the user with a BEOL or passivation layer specification capable of reducing/minimizing the influence of alpha particles, so as to assist in improving the performance of the sample 200.

Figure 7:
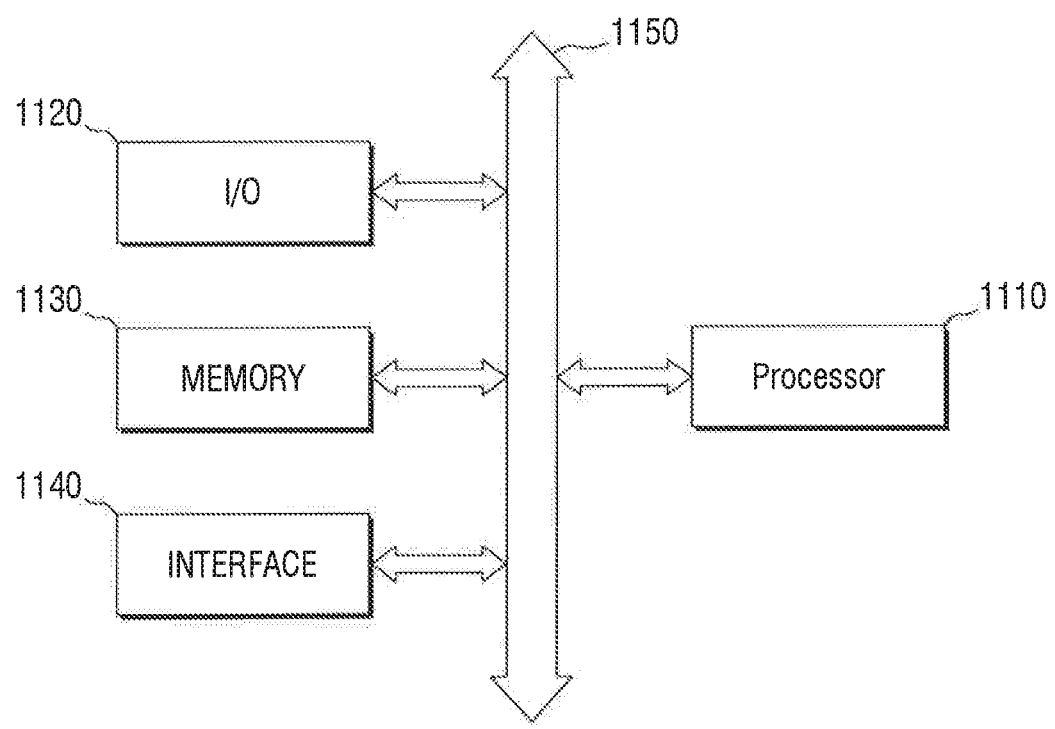
FIG. 7 is a block diagram of a data analysis device according to exemplary embodiments of the inventive concept.

FIG. 7 is a block diagram of a data analysis device according to exemplary embodiments of the inventive concept.

Referring to FIG. 7, the data analysis device according to exemplary embodiments of the inventive concept includes a processor 1110, an input/output (I/O) device 1120, a memory device 1130, an interface 1140, and a bus 1150.

The processor 1110, the I/O device 1120, the memory device 1130, and/or the interface 1140 are connected to one another via the bus 1150. The bus 1150 is a path via which data is transmitted.

The processor 1110 may include, for example, at least one of a microprocessor, a digital signal processor, a microcontroller, and a logic element performing similar functions to a microprocessor, a digital signal processor, or a microcontroller. In some exemplary embodiments, the processor 1110 may be implemented as a multi-core environment including a plurality of cores.

Examples of the I/O device 1120 include a keypad, a keyboard, a display device, etc.

The memory device 1130 may store data and/or commands. The memory device 1130 may include one or more volatile memory devices such as, for example, DDR SDRAMs or SDR SDRAMs, which may be integrated into a single semiconductor device, and/or one or more non-volatile memory devices such as EEPROMs or flash memories.

The data analysis device according to exemplary embodiments of the inventive concept may further include, for example, a high-speed Dynamic Random Access Memory (DRAM) and/or Static Random Access Memory (SRAM), as an operating memory to improve the operation of the processor 1110.

The interface 1140 transmits data to or receives data from a communication network. The interface 1140 may be a wired or wireless interface. Examples of the interface 1140 include an antenna, a wired or wireless transceiver, etc.

The bus 1150 may have a multilayer structure. For example, a multilayer Advanced High-performance Bus (AHB) or a multilayer Advanced eXtensible Interface (AXI) may be used as the bus 1150. However, exemplary embodiments of the inventive concept are not limited thereto.

The data analysis device according to exemplary embodiments of the inventive concept may be applied to the main controller 150 or the control terminal 160 of the semiconductor test device according to exemplary embodiments of the inventive concept.

In an exemplary embodiment, the main controller 150 includes the processor 1110 and the memory device 1130. The memory device 1130 may store therein a data analysis module, which receives input data from an external source and calculates the metal-to-dielectric ratio of the sample 200 using the processor 1110.

The input data may include a frequency of occurrence of single events (SEs) corresponding to a measured distance between the sample 200 and the radiation source 300. As described above, SEs are errors that occur in the sample 200 due to alpha particles emitted from the radiation source 300. The frequency of occurrence of SEs may be calculated based on the number of SEs occurring in the sample 200 for a predefined amount of time. However, exemplary embodiments of the inventive concept are not limited thereto.

In exemplary embodiments, the processor 1110 calculates the SER of the sample 200 based on a frequency of occurrence of single events (SEs) corresponding to the measured distance between the sample 200 and the radiation source 300, calculates the first distance, which is the distance between the radiation source 300 and the sample 200 at which the SER of the sample 200 becomes zero, and calculates the second distance, which is the distance between the radiation source 300 and the sample 200 at which the SER of the sample 200 reaches its peak, based on data regarding the relationship between the SER of the sample 200 and the measured distance between the sample 200 and the radiation source 300. The processor 1110 further calculates the metal-to-dielectric ratio of the sample 200 based on the first distance.

In exemplary embodiments, the processor 1110 calculates the metal-to-dielectric ratio of the BEOL layer of the sample 200 based on the first distance, the thickness of the passivation layer of the sample 200, and the thickness of the BEOL layer.

In exemplary embodiments, the processor 1110 calculates the metal-to-dielectric ratio of the BEOL layer of the sample 200 using an LUT showing the relationship between the thickness of the BEOL layer and the metal-to-dielectric ratio of the BEOL layer. The processor 1110 calculates the metal-to-dielectric ratio of the BEOL layer of the sample 200 based on data regarding the relationship between radiation energy loss in a material and the thickness of the material.

The data analysis device according to exemplary embodiments includes a memory 1130 storing a computer program and receiving the input data. The processor 1110 executes the computer program to perform the operations described herein.

In exemplary embodiments, the memory device 1130 receives a test pattern, which is to be transmitted to the sample 200, and data regarding a result value for the test pattern, from an external source. The memory device 1130 may store the test pattern and the data, and may store the frequency of occurrence of SEs corresponding to the measured distance between the sample 200 and the radiation source 300. The frequency of occurrence of SEs corresponding to the measured distance between the sample 200 and the radiation source 300 may be provided to a user via the control terminal 160.

In response to an SE occurring in the sample 200, the processor 1110 may correct the value of a portion of the sample 200 where the SE occurs with the result value for the test pattern stored in the memory 1130.

In exemplary embodiments, the main controller 150 includes the memory device 1130, which stores an algorithm and an LUT for calculating the metal-to-dielectric ratio of the BEOL layer of the sample 200, and the processor 1110, which executes the algorithm.

The LUT may include data regarding the correlation between the thickness of a BEOL layer and the metal-to-dielectric ratio of the BEOL layer.

In exemplary embodiments, the algorithm calculates the first distance, which is the distance between the radiation source 300 and the sample 200 at which the SER of the sample 200 becomes zero, based on SEs that have occurred in the sample 200, and calculates the metal-to-dielectric ratio of the BEOL layer of the sample 200 based on the first distance and the LUT. The algorithm calculates the SER of the sample 200 based on the number of SEs occurring in the sample 200 for a predefined amount of time.

The memory device 1130 may store a test pattern for detecting SEs from the sample 200 and a result value for the test pattern. In response to an SE occurring in the sample 200, the algorithm may correct the value of a portion of the sample 200 where the SE occurs using the result value for the test pattern. For example, the algorithm may replace the value of the portion of the sample 200 where the SE occurs with the result value, or the algorithm may modify the value of the portion of the sample 200 using the result value. However, exemplary embodiments of the inventive concept are not limited thereto.

Figure 8:
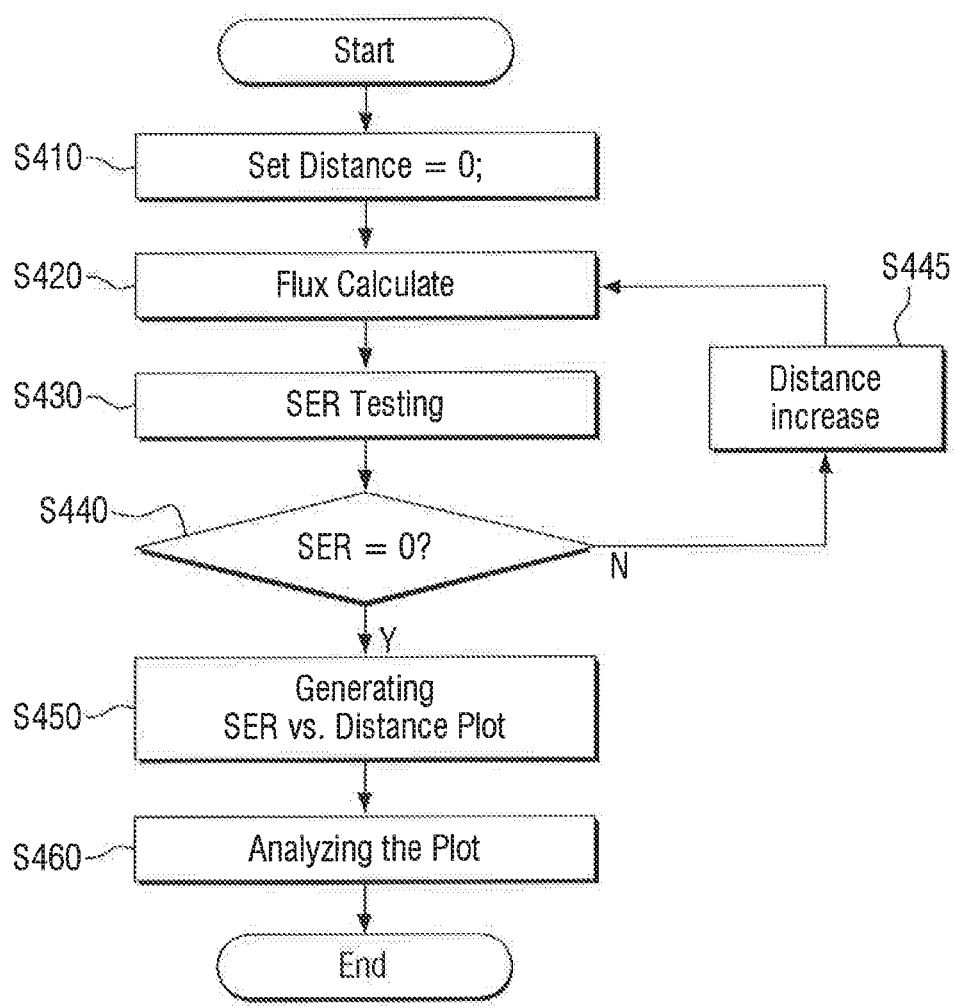
FIG. 8 is a flowchart of an operating method of the semiconductor test device according to exemplary embodiments of the inventive concept.

FIG. 8 is a flowchart of an operating method of the semiconductor test device according to exemplary embodiments of the inventive concept. FIG. 9 is a flowchart of an SER test method of FIG. 8 according to exemplary embodiments of the inventive concept. FIG. 10 is a flowchart of a data analysis method of FIG. 8 according to exemplary embodiments of the inventive concept. FIG. 11 is a graph showing the SER of a sample according to the distance between a radiation source and a sample according to exemplary embodiments of the inventive concept. FIG. 12 is a graph showing the relationship between radiation energy loss in a material and the thickness of the material according to exemplary embodiments of the inventive concept. FIGS. 13A through 13C are tables each showing penetration depths and metal-to-dielectric ratios for each given radiation energy.

Referring to FIG. 8, the distance between the radiation source 300 and the sample 200 is set to zero by adjusting the location of the actuator 120 (S410). For example, the distance between the radiation source 300 and the sample 200 may be set to zero by causing the radiation source 300 and the sample 200 to contact each other. Operation S410 corresponds to the initialization of the semiconductor test device according to exemplary embodiments of the inventive concept. The main controller 150 may align the center of the radiation source 300 and the center of the sample 200 by adjusting the pillar unit 122 of the actuator 120, and may set the distance D between the radiation source 300 and the sample 200 to be zero by adjusting the connecting unit 124 of the actuator 120.

Thereafter, the flux of radiation (for example, alpha particles) emitted from the radiation source 300 is calculated (S420) to calculate the flux of radiation incident upon the sample 200. In response to the distance D between the radiation source 300 and the sample 200 being zero, radiation emitted from the radiation source 300 may be incident upon the sample 200 without any loss. As the distance D between the radiation source 300 and the sample 200 increases, the flux of radiation incident upon the sample 200 may gradually decrease. The flux of radiation incident upon the sample 200 may be calculated based on the distance D between the radiation source 300 and the sample 200.

Thereafter, the SER of the sample 200 is tested/measured (S430). Operation S430 will be described in detail with reference to FIG. 9.

Thereafter, a determination is made as to whether the SER of the sample 200 measured in operation S430 is zero (S440).

In response to determining that the SER of the sample 200 measured in operation S430 is not zero, the distance D between the radiation source 300 and the sample 200 increases (S445), and operations S420, S430, and S440 are performed again.

Alternatively, in response to determining that the SER of the sample 200 measured in operation S430 is zero, a graph is plotted of the SER of the sample 200 against the distance D between the radiation source 300 and the sample 200 based on data regarding the relationship between the SER of the sample 200 and a measured distance between the radiation source 300 and the sample 200 (S450).

Thereafter, an SER of the sample 200 corresponding to the measured distance between the radiation source 300 and the sample 200 is analyzed (S460). Operation S460 will be described in detail with reference to FIG. 10.

Figure 9:
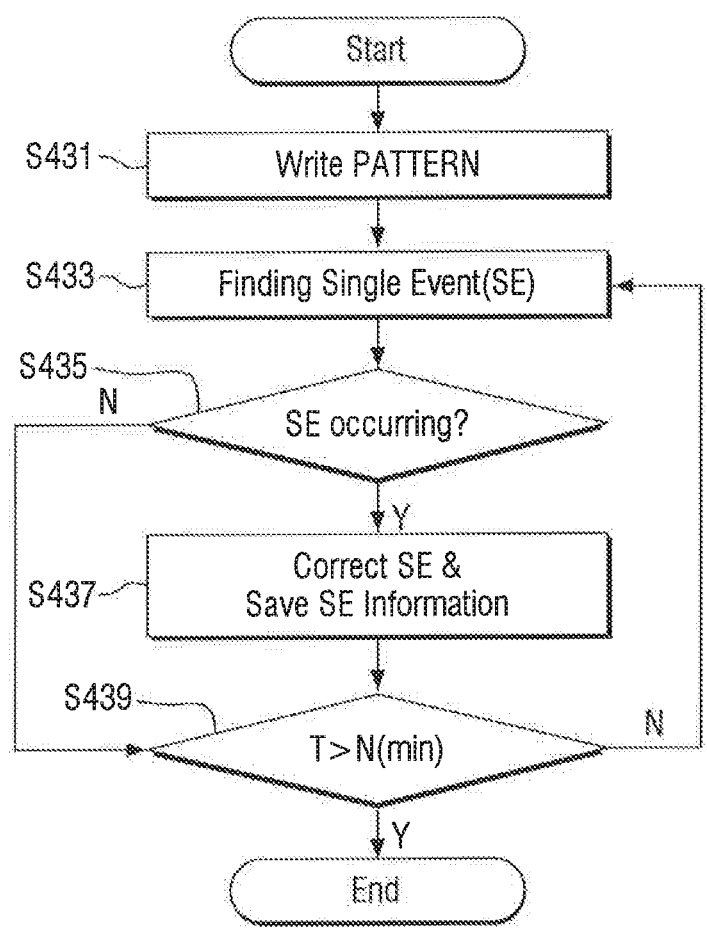
FIG. 9 is a flowchart of a soft error rate (SER) test method of FIG. 8 according to exemplary embodiments of the inventive concept.

Referring to FIG. 9, to test the SER of the sample 200, a test pattern and a result value for the test pattern are recorded on a memory (S431). The test pattern and the result value, which are for, for example, detecting an SE from the sample 200, may be received from the control terminal 160, and may be stored in a memory included in the main controller 150. However, exemplary embodiments of the inventive concept are not limited thereto. For example, the test pattern and the result value may already be embedded in the main controller 150.

Thereafter, a determination is made as to whether an SE has occurred in the sample 200 (S433 and S435). The occurrence of an SE may be detected by providing a test pattern for the sample 200 via the DUT board 140 and determining whether the output of the sample 200 matches a result value for the test pattern.

In response to determining that an SE has occurred, information regarding the occurrence of the SE is stored, and the value of a portion of the sample 200 where the SE has occurred is corrected with the result value for the test pattern (S437).

After operation S437, as well as in response to determining that an SE has not occurred at operation S435, a determination is made as to whether an SER test period T has exceeded a reference time N (S439). In response to determining that the SER test period T has not yet exceeded the reference time N, operations S433, S435, and S437 are performed again.

Alternatively, in response to determining that the SER test period T has exceeded the reference time N, the testing of the SER of the sample 200 is terminated.

As shown in FIG. 9, even in response to determining that an SE has not occurred, a determination is still made as to whether the SER test period T has exceeded the reference time N (S439). In response to determining that the SER test period T has not yet exceeded the reference time N, operations S433, S435, and S437 are performed again. Alternatively, in response to determining that the SER test period T has exceeded the reference time N, the testing of the SER of the sample 200 is terminated.

Figure 10:
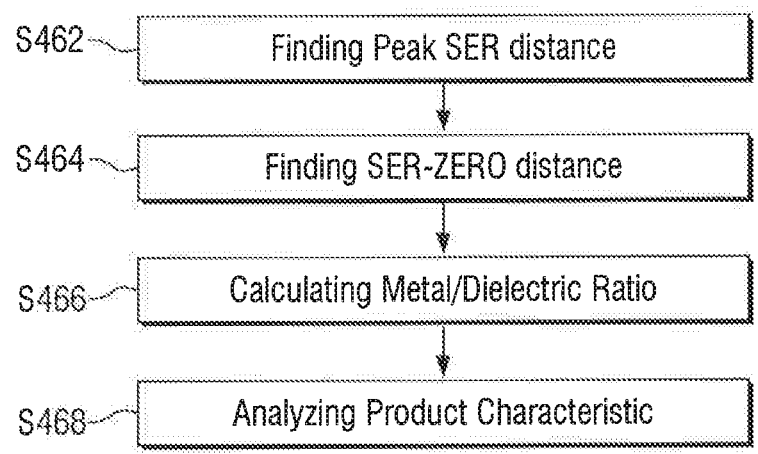
FIG. 10 is a flowchart of a data analysis method of FIG. 8 according to exemplary embodiments of the inventive concept.
Figure 11:
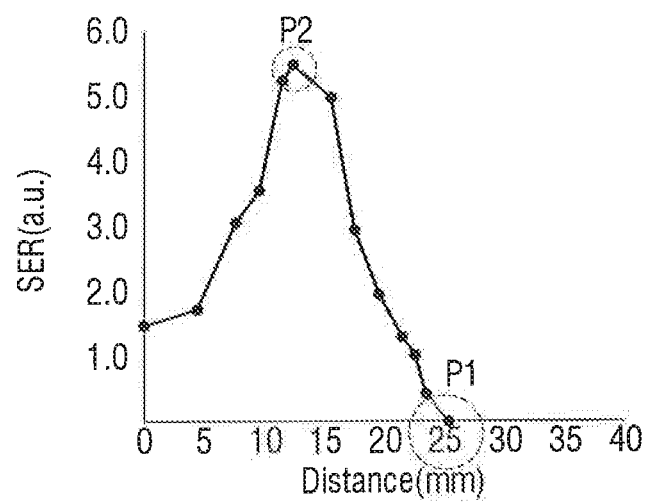
FIG. 11 is a graph showing the SER of a sample according to the distance between a radiation source and a sample according to exemplary embodiments of the inventive concept.
Figure 12:
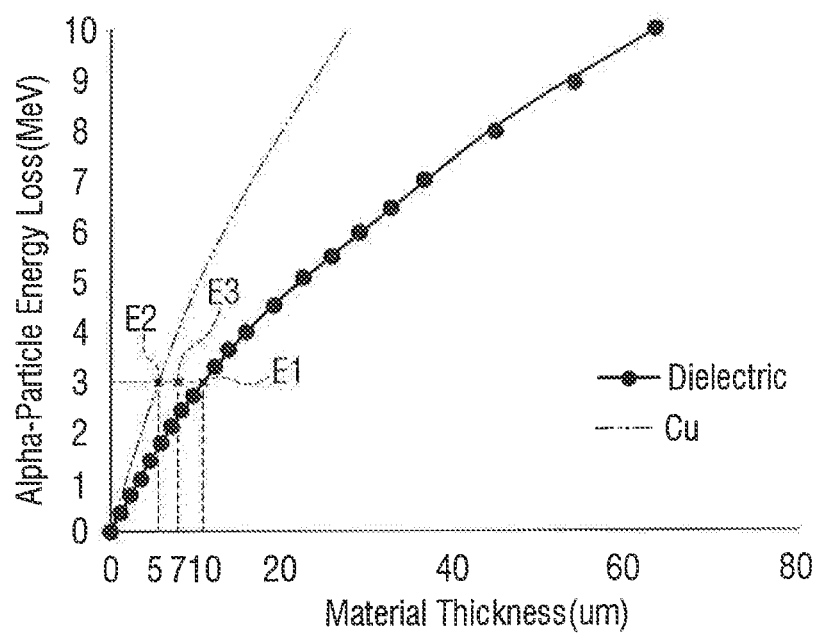
FIG. 12 is a graph showing the relationship between radiation energy loss in a material and the thickness of the material according to exemplary embodiments of the inventive concept.

Referring to FIGS. 10 and 11, a distance P2 at which the SER of the sample 200 reaches its peak is determined (S462) using a graph of the SER of the sample 200 against the distance D between the radiation source 300 and the sample 200 (for example, the graph of FIG. 11).

Thereafter, a distance P1 at which the SER of the sample 200 becomes zero is determined (S464) using the graph of the SER of the sample 200 against the distance D between the radiation source 300 and the sample 200 (for example, the graph of FIG. 11).

Thereafter, the metal-to-dielectric ratio of the sample 200 is calculated based on the distance P1 (S466). Operation S466 will be described in detail with reference to FIGS. 12 through 13C.

Thereafter, the product characteristics of the sample 200 are analyzed (S468). The product characteristics of the sample 200 may be analyzed using data regarding the SER of the sample 200 and the Bragg peak of the sample 200 with respect to alpha particles. As a result, an optimum thickness of the passivation layer or the BEOL layer included in the sample 200 may be calculated. It is to be understood that the aforementioned description of the operation of the semiconductor test device and the data analysis device is exemplary, and that exemplary embodiments of the inventive concept are not limited thereto.

Although operations S462 and S464 are illustrated in FIG. 10 as being performed one after another, exemplary embodiments of the inventive concept are not limited thereto. For example, in exemplary embodiments, operations S462 and S464 may be performed in a different order from that illustrated in FIG. 10 or may be performed at substantially the same time.

FIG. 12 is a graph showing the relationship between energy loss of alpha particles in a material and the thickness of the material. Based on the graph of FIG. 12, the metal-to-dielectric ratio of the sample 200 may be calculated.

For example, in exemplary embodiments, the metal-to-dielectric ratio of the BEOL layer of the sample 200 is calculated based on data regarding the relationship between radiation energy loss in a material and the thickness of the material.

For example, referring to FIG. 12, in response to the amount of energy consumed and lost in the BEOL layer of the sample 200 and the thickness of the BEOL layer being about 3 MeV and about 7 um, respectively, the BEOL layer corresponds to E3. Since the thickness of Cu consuming 3 MeV of energy is about 5 um (E2) and the thickness of a dielectric material consuming about 3 MeV of energy is about 10 um (E1), the ratio of the distance between E2 and E3 and the distance between E1 and E3 corresponds to the Cu-to-dielectric ratio of the BEOL layer. However, exemplary embodiments of the inventive concept are not limited thereto.

FIGS. 13A through 13C are LUTs showing penetration depths and the metal-to-dielectric ratios of BEOL layers according to exemplary embodiments of the inventive concept. For example, FIGS. 13A through 13C are exemplary LUTs for radiation sources 300 having different alpha particles.

The semiconductor test device according to exemplary embodiments of the inventive concept calculates the metal-to-dielectric ratio of the BEOL layer of the sample 200 based on the distance P1 of FIG. 11, the thickness of the passivation layer of the sample 200, and the thickness of the BEOL layer of the sample 200.

For example, referring to FIGS. 6 and 13C, in an exemplary embodiment, an initial energy Eini of alpha particles emitted from the radiation source 300 is about 5.5 MeV. An energy loss Eair of the alpha particles in the air between the radiation source 300 and the sample 200 may be calculated based on the distance between the radiation source 300 and the sample 200. An energy loss Epas of the alpha particles in the passivation layer of the sample 200 may be calculated based on data regarding the thickness of the passivation layer of the sample 200. Since the alpha particles do not cause any error in the sample 200, an energy loss Ebeol of the alpha particles in the BEOL layer of the sample 200 may be calculated by subtracting the sum of the energy losses Eair and Epas from the energy loss Eini.

Thereafter, the metal-to-dielectric ratio of the BEOL layer of the sample 200 may be calculated based on the thickness of the BEOL layer of the sample 200 using the energy loss Ebeol and an LUT corresponding to the energy loss Ebeol. For example, in response to the thickness of the BEOL layer of the sample 200 and the energy loss Ebeol being about 2.8 nm and about 1 MeV, respectively, the metal-to-dielectric ratio of the BEOL layer of the sample 200 may be 0.4. However, exemplary embodiments of the inventive concept are not limited thereto.

While the present inventive concept has been particularly shown and described with reference to the exemplary embodiments thereof, it will be understood by those of ordinary skill in the art that various changes in form and detail may be made therein without departing from the is spirit and scope of the present inventive concept as defined by the following claims.

What is claimed is:

1. A semiconductor test device, comprising:
an actuator holding a radiation source and adjusting a distance between the radiation source and a sample; and
a controller controlling an operation of the actuator and calculating a soft error rate (SER) of the sample based on the distance between the radiation source and the sample,
wherein the controller calculates a first distance between the radiation source and the sample at which the SER of the sample becomes zero, and calculates a metal-to-dielectric ratio of the sample based on the first distance.

2. The semiconductor test device of claim 1, wherein the controller calculates a metal-to-dielectric ratio of a Back-End-Of-Line (BEOL) layer included in the sample based on a thickness of a passivation layer included in the sample and a thickness of the BEOL layer.

3. The semiconductor test device of claim 2, wherein the controller calculates the metal-to-dielectric ratio of the BEOL layer using a lookup table (LUT) showing a relationship between the thickness of the BEOL layer and the metal-to-dielectric ratio of the BEOL layer.

4. The semiconductor test device of claim 2, wherein the controller calculates the metal-to-dielectric ratio of the BEOL layer based on data regarding a relationship between radiation energy loss in a material and a thickness of the material.

5. The semiconductor test device of claim 1, wherein the controller controls the actuator to change the distance between the radiation source and the sample from zero to the first distance.

6. The semiconductor test device of claim 5, wherein the controller calculates a second distance between the radiation source and the sample at which the SER of the sample reaches its peak.

7. The semiconductor test device of claim 1, wherein the controller calculates the SER of the sample based on a number of single events (SEs) occurring in the sample for a predefined amount of time, wherein the SEs correspond to errors occurring in the sample due to alpha particles emitted from the radiation source.

8. The semiconductor test device of claim 7, wherein the controller comprises a memory that stores a test pattern for detecting an SE occurring in the sample and a result value for the test pattern,
wherein, in response to the SE occurring in the sample, the controller corrects a value of a portion of the sample where the SE has occurred using the result value for the test pattern.

9. The semiconductor test device of claim 1, wherein the actuator comprises:
a pillar unit substantially perpendicularly disposed on a substrate and moving in a first direction over the substrate;
a connecting unit moving in a second direction that is substantially perpendicular to the first direction, wherein the connecting unit is moved by the pillar unit; and
a holding unit connected to an end of the connecting unit and holding the radiation source.

10. The semiconductor test device of claim 9, wherein the holding unit comprises an opening formed at a bottom surface of the holding unit, wherein the opening exposes a part of the radiation source.

11. The semiconductor test device of claim 9, wherein the pillar unit aligns a center of the sample and a center of the radiation source.

12. The semiconductor test device of claim 1, further comprising:
a Device Under Test (DUT) board fixing the sample, supplying power to the sample, and transmitting data obtained from the sample to the controller.

* * * * *